United States Patent
Yoon

(10) Patent No.: US 7,898,866 B2
(45) Date of Patent: Mar. 1, 2011

(54) NONVOLATILE MEMORY DEVICE AND METHOD OF OPERATING THE SAME

(75) Inventor: Mi Sun Yoon, Jeollabuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 68 days.

(21) Appl. No.: 12/493,492

(22) Filed: Jun. 29, 2009

(65) Prior Publication Data

US 2010/0124107 A1  May 20, 2010

(30) Foreign Application Priority Data

Nov. 14, 2008  (KR) ................... 10-2008-0113427

(51) Int. Cl.
*G11C 16/06* (2006.01)
(52) U.S. Cl. ............... 365/185.2; 365/230.06; 365/189.04; 365/189.09; 365/189.08
(58) Field of Classification Search ............. 365/185.2, 365/230.01, 230.06, 189.04, 185.03, 189.09, 365/189.08
See application file for complete search history.

(56) References Cited

U.S. PATENT DOCUMENTS

2006/0268654 A1 * 11/2006 Chae et al. ............. 365/230.08

FOREIGN PATENT DOCUMENTS

KR  1020080056586 A  6/2008

OTHER PUBLICATIONS

Notice of Allowance issued from Korean Intellectual Property Office on May 31, 2010.

* cited by examiner

*Primary Examiner*—Thong Q Le
(74) *Attorney, Agent, or Firm*—IP & T Group LLP

(57) ABSTRACT

A nonvolatile memory device includes a first plane and a second plane, an address decoder configured to decode an externally input address and to output a first plane select signal and a second plane select signal for enabling any one of the first and second planes, a controller configured to output a first plane hold signal and a second plane hold signal for disabling any one of the first and second planes depending on program states of the first plane and the second plane, a first plane control unit configured to enable the first plane in response to a first plane select signal and the first plane hold signal, and a second plane control unit configured to enable the second plane in response to a second plane select signal and the second plane hold signal.

18 Claims, 7 Drawing Sheets

| | P0 | | P1 | | P0 | P1 |
|---|---|---|---|---|---|---|
| LSB | R1 | R2 | R1 | R2 | R1 | R1 |
| Flag cell | | | | | | |
| LSB | R1 | R2 R3 | R1 | R2 R3 | R1→R2 | R1→R2→R3 |
| Flag cell | | | | | | |
| MSB | R1 | R2 R3 | R1 | R2 | R1→R2→R3 | R1 |
| Flag cell | | | | | | |
| MSB | R1 | R2 R3 | R1 | R2 R3 | R1→R2→R3 | R1→R2→R3 |
| Flag cell | | | | | | |

NONVOLATILE MEMORY DEVICE AND METHOD OF OPERATING THE SAME

CROSS-REFERENCES TO RELATED APPLICATIONS

Priority to Korean patent application number 10-2008-0113427 filed on Nov. 14, 2008, the entire disclosure of which is incorporated by reference herein, is claimed.

BACKGROUND

One or more embodiments relate to a nonvolatile memory device and a method of operating the same.

Recently, there has been an increasing demand for nonvolatile memory devices which can be electrically programmed and erased and do not require the refresh function of rewriting data at specific periods.

A nonvolatile memory cell enables electrical program/erase operations and performs the program and erase operations by varying a threshold voltage when electrons are migrated by a strong electric field applied to a thin oxide layer.

The nonvolatile memory device typically includes a memory cell array in which cells for storing data are arranged in matrix form and a page buffer for writing data into specific cells of the memory cell array or reading data stored in specific cells thereof. The page buffer includes bit line pairs connected to specific memory cells, a register for temporarily storing data to be written into the memory cell array or reading the data of specific cells from the memory cell array and temporarily storing the read data, a sensing node for detecting the voltage level of a specific bit line or a specific register, and a bit line select unit for controlling whether to connect the specific bit line to the sensing node.

A nonvolatile memory device including several planes may be configured. Each of the planes includes memory cell blocks and a page buffer unit which is independently driven. A read operation for a nonvolatile memory device having the above multi-plane structure is performed on the planes at the same time. In other words, a read operation is performed on two different planes using the same voltage.

However, a program state may differ at every plane with the introduction of a Multi-Level Cell (MLC) program method. Accordingly, when the read operation is performed on planes at the same time, a problem may arise.

BRIEF SUMMARY

One or more embodiments are directed towards a nonvolatile memory device and a method of operating the same, which is capable of controlling whether to perform a read operation for each plane depending on a program state of a nonvolatile memory device.

One or more embodiments are directed to a nonvolatile memory device, including a first plane and a second plane, an address decoder configured to decode an externally input address and to output a first plane select signal and a second plane select signal for enabling a corresponding plane of the first and second planes, a controller configured to output a first plane hold signal and a second plane hold signal for disabling any one of the first and second planes depending on program states of the first plane and the second plane, a first plane control unit configured to enable the first plane in response to a first plane select signal and the first plane hold signal, and a second plane control unit configured to enable the second plane in response to a second plane select signal and the second plane hold signal.

One or more embodiments are directed to a method of operating a nonvolatile memory device, including performing a read operation on cells of first and second planes on the basis of a second reference voltage, if, as a result of the read operation, an MSB (most significant bit) program operation has been performed on the first plane, outputting a first plane hold signal for disabling the first plane, if, as a result of the read operation, an MSB program operation has been performed on the second plane, outputting a second plane hold signal for disabling the second plane, performing a read operation on the basis of a first reference voltage for a plane on which an LSB (least significant bit) program operation has been performed as a result of the read operation, and stopping the output of the first plane hold signal or the second plane hold signal.

One or more embodiments are directed to a method of operating a nonvolatile memory device, including performing a read operation on cells of first and second planes on the basis of a second reference voltage, if, as a result of the read operation, an LSB program operation has been performed on the first plane, outputting a first plane hold signal for disabling the first plane, if, as a result of the read operation, an LSB program operation has been performed on the second plane, outputting a second plane hold signal for disabling the second plane, sequentially performing a read operation on the basis of a second reference voltage and a read operation on the basis of a third reference voltage for a plane on which an MSB program operation has been performed as a result of the read operation, and stopping the output of the first plane hold signal or the second plane hold signal.

BRIEF DESCRIPTION OF THE DRAWINGS

FIG. 4 is a diagram showing a Least Significant Bit (LSB) read method, which belongs to a method of reading the nonvolatile memory device having a multi-plane structure;

FIG. 5 is a diagram showing is a diagram showing a Most Significant Bit (MSB) read method, which belongs to a method of reading the nonvolatile memory device having a multi-plane structure;

DESCRIPTION OF SPECIFIC EMBODIMENT

Hereinafter, the present disclosure will be described in detail in connection with one or more embodiments with reference to the accompanying drawings. The figures are provided to allow those having ordinary skill in the art to understand the scope of one or more embodiments of the disclosure.

Figure 1:
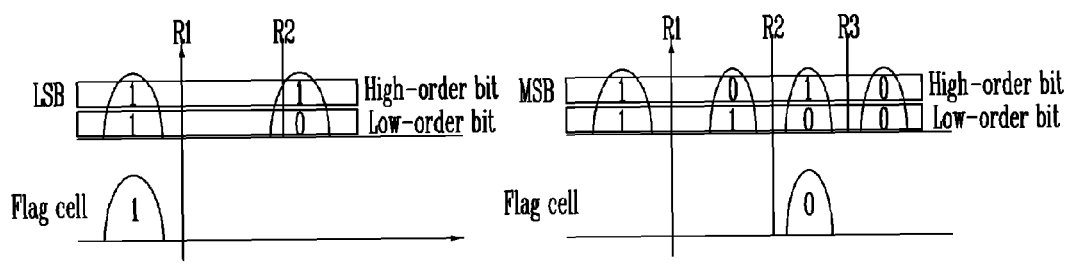
FIG. 1 is a diagram showing the concept of a method of reading a nonvolatile memory device using an MLC program method.
Figure 2:
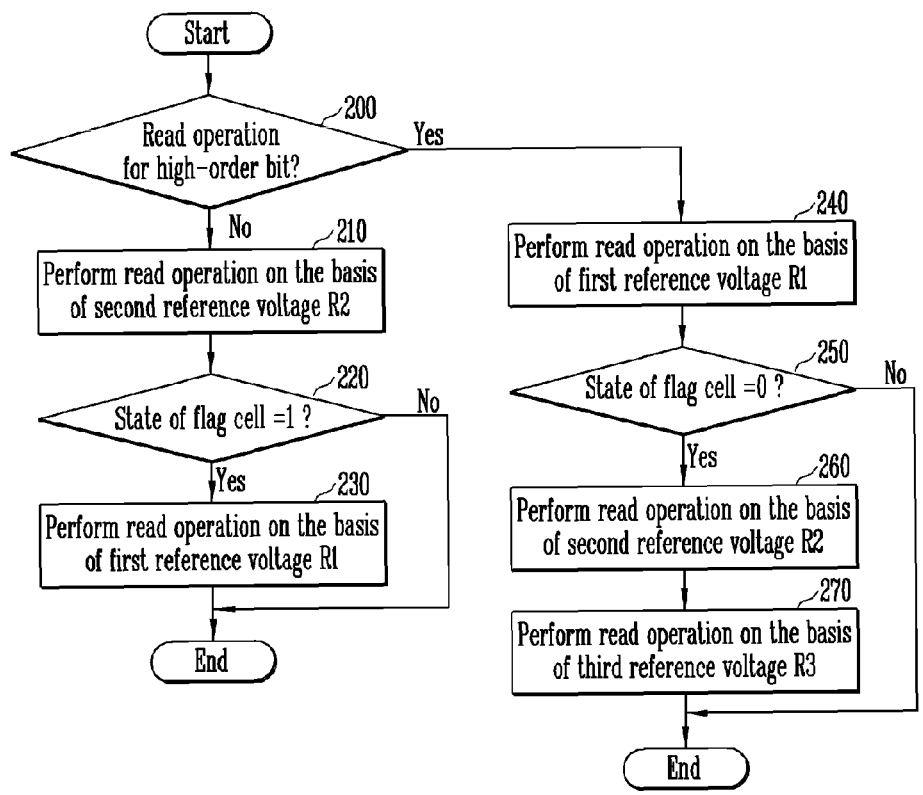
FIG. 2 is a flowchart showing a method of reading a nonvolatile memory device using an MLC program method.

FIG. 1 is a diagram showing the concept of a method of reading a nonvolatile memory device using an MLC program method, and FIG. 2 is a flowchart showing a method of reading a nonvolatile memory device using an MLC program method.

The drawings illustrate a 2-bit MLC program method of storing 2-bit data in one cell. After an LSB program operation is performed, an MSB program operation is performed. Here, in order to check whether only the LSB program operation has been performed on a corresponding page or performed up to the MSB program operation on the corresponding page, a flag cell is provided in a spare cell area and data, indicating whether or not the MSB program operation has been performed on a corresponding cell, is stored in the flag cell. The memory cell array of a nonvolatile memory device generally includes a main memory cell area and a spare cell area sharing word lines. A program operation and a read operation can be performed at the same time because the word lines are shared by the main memory cell area and the spare cell area. External data is stored in the main memory cell area, and various pieces of supplementary information necessary for the operation of a nonvolatile memory device are stored in the spare cell area. One or more of the spare cells are used as a flag cell.

A program operation is not performed on the flag cell during an LSB program operation, but is performed on the flag cell during an MSB program operation. Accordingly, whether or not the MSB program operation has been performed can be checked by reading the flag cell.

A detailed read operation is described below with reference to the flowchart of FIG. 2.

It is first determined whether a read operation is a read operation for a low-order bit or a read operation for a high-order bit at step 200.

In a 2-bit MLC program operation, 2-bit data is stored in one cell. Thus, it is first determined as to which one of the high and low-order bits that a read operation is being performed.

If, as a result of the determination, the read operation is determined to be the read operation for the low-order bit, the read operation is performed on the main memory cell and the flag cells on the basis of a second reference voltage R2 at step 210.

It is then determined whether the flag cells are determined to have been programmed with the second reference voltage R2 or more (the state of the flag cells=0) at step 220. If, as a result of the determination, the flag cells are determined to have been programmed with the second reference voltage R2 or more, the read operation is terminated.

From FIG. 1, the state of the flag cells depending on the read operation on the basis of the second reference voltage R2 can be checked. In the case where the flag cells are determined to have been programmed with the second reference voltage R2 or more as described above, it is determined that an MSB program operation has been performed. In this case, an additional read operation is not performed because data output at step 210 is output without change. In other words, as shown in the right-side drawing of FIG. 1, low-order bit data can be distinguished on the basis of the second reference voltage R2, so no further read operation is performed.

However, if, as a result of the determination at step 220, the flag cells have not been programmed to have the second reference voltage R2 or more, the read operation is performed on the basis of a first reference voltage R1 at step 230.

If, as a result of the read operation, an MSB program operation has not been performed, the data read at step 210 may not have a programmed state. As shown in the left-side drawings of FIG. 1, low-order bit data cannot be distinguished on the basis of only the second reference voltage R2. Accordingly, an additional read operation is performed on the basis of the first reference voltage R1.

Next, if, as a result of the determination at step 200, the read operation is determined to be the read operation for the high-order bit, a read operation for the main memory cell and the flag cells is performed on the basis of the first reference voltage R1 at step 240.

It is then determined whether the flag cells have been programmed to have the first reference voltage R1 or more (the state of the flag cells=0) at step 250. If, as a result of the determination, the flag cells have not been programmed to have the first reference voltage R1 or more, the read operation is terminated.

From FIG. 1, the state of the flag cells depending on the read operation on the basis of the first reference voltage R1 can be checked. If, as a result of the read operation, the flag cells have not been programmed to have the first reference voltage R1 or more (the state of the flag cells=1), it is determined that an MSB program operation has not been performed. Accordingly, an additional read operation is not performed because all high-order bits on which the MSB program operation has not been performed have the same data (i.e., '1'). In other words, as shown in the left-side drawings of FIG. 1, data can be checked without an additional read operation because high-order bit data are the same.

However, if, as a result of the determination at step 250, the flag cells are determined to have been programmed with the first reference voltage R1 or more (the state of the flag cells=0), a read operation on the basis of the second reference voltage R2 and a read operation on the basis of a third reference voltage R3 are sequentially performed at steps 260 and 270.

If, as a result of the read operations, an MSB program operation has been performed, a total of three read operations are required in order to distinguish high-order bit data. In other words, as shown in the right-side drawings of FIG. 1, in order to distinguish the high-order bit data, the respective read operations have to be performed on the basis of the first to third reference voltages. Here, since the read operation has already been performed on the basis of the first reference voltage R1 at step 240, the remaining read operations have only to be performed on the basis of the second and the third reference voltages, respectively, in subsequent steps.

As described above, data of the nonvolatile memory device on which an MLC program operation has been performed based on the state of the flag cells can be read.

However, if this read method is applied to a nonvolatile memory device having a multi-plane structure, the following problems may occur.

Figure 3:
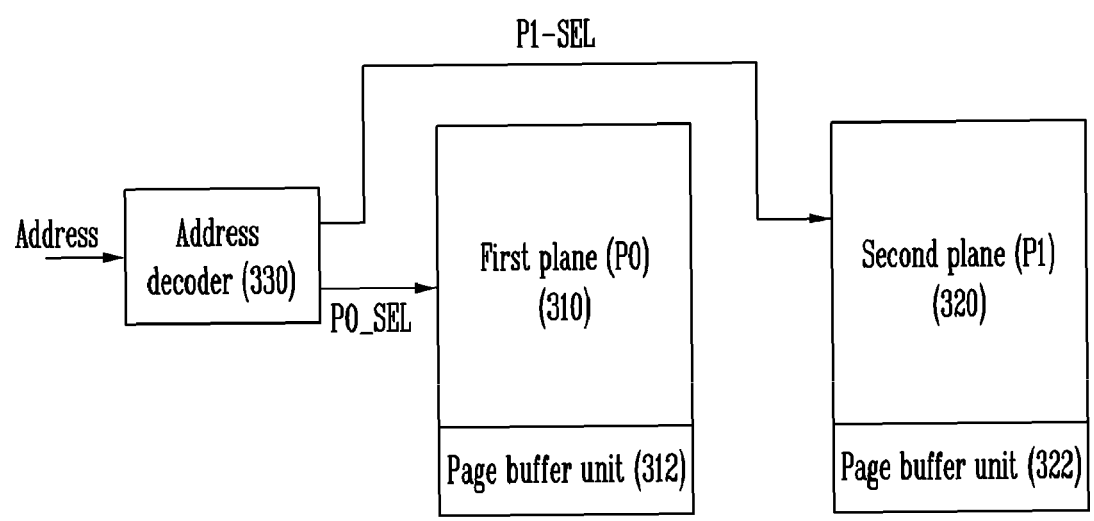
FIG. 3 is a diagram showing a nonvolatile memory device having a multi-plane structure.

FIG. 3 is a diagram showing a nonvolatile memory device having a multi-plane structure.

The nonvolatile memory device 300 includes a first plane 310 and a second plane 320 having respective page buffer units 312 and 322 which are independently driven. Each of the planes includes memory cell blocks (i.e., the units of respective memory cell arrays) and the page buffer unit which is independently driven.

That is, a program, read, or an erase operation is performed on the first plane 310 using the page buffer unit 312 connected to the first plane. In a similar way, a program, read, or an erase operation is performed on the second plane 320 using the page buffer unit 322 connected to the second plane.

An address decoder 330 decodes an externally input address and outputs a first plane select signal P0_SEL or a second plane select signal P1_SEL. One of the two planes is enabled in response to the select signal.

Figure 4:
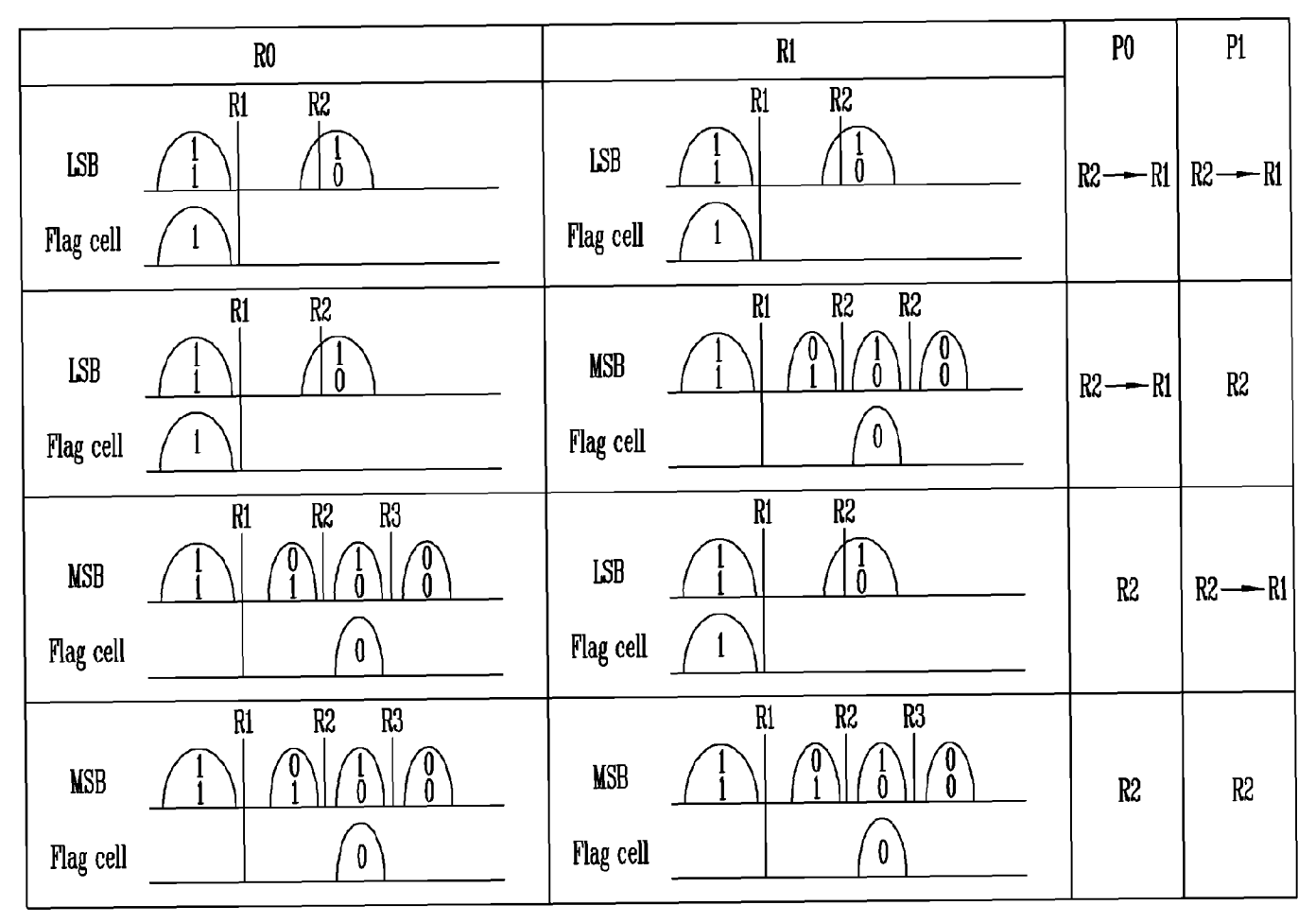

FIG. 4 is a diagram showing an LSB read method, which belongs to a method of reading the nonvolatile memory device having a multi-plane structure, and FIG. 5 is a diagram showing is a diagram showing an MSB read method, which belongs to a method of reading the nonvolatile memory device having a multi-plane structure.

In the case where low-order bit data is read in the state where only an LSB program operation has been performed as described above, a read operation on the basis of a second reference voltage R2 and a read operation on the basis of a first reference voltage R1 are performed. In the case where low-order bit data is read in the state where an MSB program operation has been performed, however, only the read operation on the basis of the second reference voltage R2 is performed.

Meanwhile, in the state where only an LSB program operation has been performed as shown in FIG. 5, an additional read operation for reading high-order bit data other than the read operation on the basis of the first reference voltage R1 is not performed. In the case where high-order bit data is read in the state where an MSB program operation has been performed, however, the read operations respectively on the basis of the first to third reference voltages have to be sequentially performed.

It may be assumed that, as shown in FIG. 4, only an LSB program operation has been performed on cells included in the first plane and performed up to an MSB program operation on cells included in the second plane. In a nonvolatile memory device having a multi-plane structure, the same read operation is performed on the planes. If whether or not to perform the MSB program operation differs for every plane as described above, a read method for each plane is different.

In a similar way, it may be assumed that, as shown in FIG. 5, only an LSB program operation has been performed on the cells included in the first plane and performed up to an MSB program operation on the cells included in the second plane. Even in this case, read algorithms must be different depending on respective planes.

Figure 6:
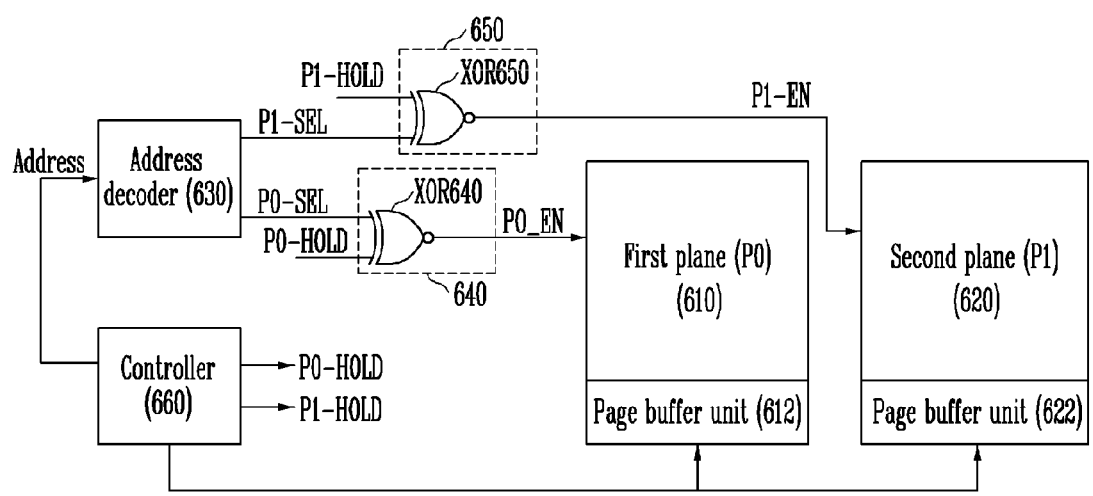
FIG. 6 is a diagram of a nonvolatile memory device according to an embodiment.

FIG. 6 is a diagram of a nonvolatile memory device according to an embodiment.

The nonvolatile memory device 600 includes a first plane 610, a second plane 620, an address decoder 630, a first plane control unit 640, a second plane control unit 650, and a controller 660.

A program operation, a read operation, an erase operation, etc. are performed on the first plane 610 using a page buffer unit 612 connected to the first plane. In a similar way, a program operation, a read operation, an erase operation, etc. are performed on the second plane 620 using a page buffer unit 622 connected to the second plane.

The address decoder 630 decodes an externally input address and outputs a first plane select signal P0_SEL or a second plane select signal P1_SEL. One of the two planes is enabled in response to the select signal.

The first plane control unit 640 generates a first plane enable signal P0_EN for enabling the first plane 610 according to the first plane select signal P0_SEL and a first plane hold signal P0_HOLD. To this end, the first plane control unit 640 includes an exclusive-OR gate XOR640 having the first plane select signal P0_SEL and the first plane hold signal P0_HOLD as inputs. Accordingly, if the first plane hold signal P0_HOLD is applied in the state where the first plane select signal P0_SEL is being applied, the exclusive-OR gate XOR640 outputs the first plane enable signal P0_EN of a low level, so the first plane 610 is disabled.

If, in the state where the first plane select signal P0_SEL is being applied, the first plane hold signal P0_HOLD is not applied, the exclusive-OR gate XOR640 outputs the first plane enable signal P0_EN of a high level, thereby driving the first plane 610.

The second plane control unit 650 generates a second plane enable signal P1_EN for enabling the second plane 620 according to the second plane select signal P1_SEL and a second plane hold signal P1_HOLD. To this end, the second plane control unit 650 includes an exclusive-OR gate XOR650 having the second plane select signal P1_SEL and a second plane hold signal P1_HOLD as inputs. Accordingly, if the second plane hold signal P1_HOLD is applied in the state where the second plane select signal P1_SEL is being applied, the exclusive-OR gate XOR650 outputs the second plane enable signal P1_EN of a low level, so the second plane 620 is disabled.

If, in the state where the second plane select signal P1_SEL is being applied, the second plane hold signal P1_HOLD is not applied, the exclusive-OR gate XOR650 outputs the second plane enable signal P1_EN of a high level, thereby driving the second plane 620.

The controller 660 controls a variety of operations, such as the program, read, and erase operations of the nonvolatile memory device. In other words, the controller 660 transfers an external address to the address decoder 630 and applies high voltages for various operations of each plane. The controller 660 controls each of the page buffer units so that various operations are performed. Furthermore, the controller 660 generates the first or second plane hold signal depending on the state of a read operation and applies a generated plane hold signal to the first or second plane control unit 640 or 650.

Figure 7:
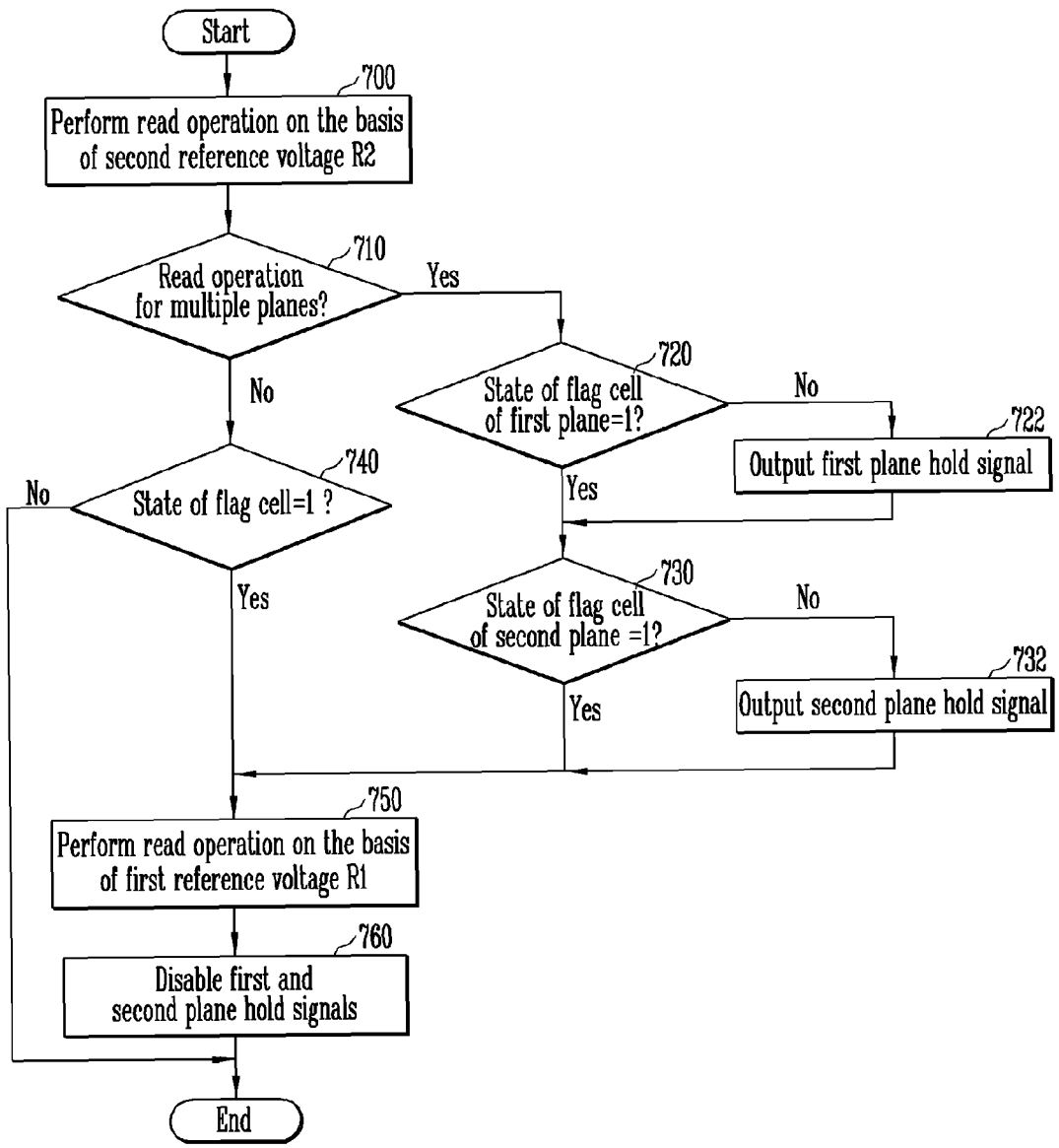
FIG. 7 is a flowchart showing an LSB read method of the nonvolatile memory device according to an embodiment.

FIG. 7 is a flowchart showing an LSB read method of the nonvolatile memory device according to an embodiment.

First, a read operation for the main memory cell and the flag cells are performed on the basis of the second reference voltage R2 at step 700. Here, in the case of performing a read operation for multiple planes, the read operation is performed on the planes at the same time.

It is then determined whether the read operation is a read operation for multiple planes at step 710. In other words, in the case where the read operation is performed on one of the planes, the read operation is performed in the same manner as the existing read operation. In the case where the read operation is performed on two or more planes, however, the read operation is performed using a different method.

If, as a result of the determination at step 710, the read operation is determined to be the read operation for a single plane, it is determined whether the flag cells have been programmed to have the second reference voltage R2 or more at step 740. If, as a result of the determination, the flag cells are determined to have been programmed with the second reference voltage R2 or more, the read operation is terminated without an additional read operation.

If, as a result of the determination at step 740, the flag cells have not been programmed to have the second reference voltage R2 or more, the read operation is performed on the basis of the first reference voltage R1 at step 750.

For the details of the step 750, the description of the embodiment in FIG. 2 may be referred.

If, as a result of the determination at step 710, the read operation is determined to be the read operation for the multiple planes, the state of the flag cells is checked based on the results read at step 700. In other words, it is determined whether, as a result of the read operation on the basis of the second reference voltage R2, the flag cells of the first plane have been programmed to have the second reference voltage R2 or more (the state of the flag cells=0) at step 720. If, as a result of the determination, the flag cells of the first plane are determined to have been programmed with the second reference voltage R2 or more, the first plane hold signal P0_HOLD is output at step 722.

In the case where the flag cells of the first plane are determined to have been programmed with the second reference voltage R2 or more (the state of the flag cells=0), the results read at step 700 are used without performing an additional read operation as described above. Accordingly, it is necessary to disable the first plane because an additional read operation is not necessary. To this end, the first plane hold signal P0_HOLD is output. Meanwhile, if, as a result of the determination at step 720, the flag cells of the first plane are determined to have been programmed with less than the second reference voltage R2 (the state of the flag cells=1), the read operation is performed on the basis of the first reference voltage R1.

It is then determined whether, as a result of the read operation on the basis of the second reference voltage R2, the flag cells of the second plane are determined to have been programmed with the second reference voltage R2 or more at step 730. If, as a result of the determination, the flag cells of the second plane are determined to have been programmed with the second reference voltage R2 or more, the second plane hold signal P1_HOLD is output at step 732.

In the case where the flag cells of the second plane are determined to have been programmed with the second reference voltage R2 or more, the results read at step 700 are used without performing an additional read operation as described above. Accordingly, it is necessary to disable the second plane because an additional read operation is not necessary. To this end, the second plane hold signal P1_HOLD is output. Meanwhile, if, as a result of the determination at step 730, the flag cells of the second plane are determined to have been programmed with less than the second reference voltage R2, the read operation is performed on the basis of the first reference voltage R1.

As described above, as a result of the read operation at step 740 or 730, the flag cells of the plane are determined to have not been programmed with the second reference voltage R2 or more (i.e., in the case where an MSB program operation has not been performed), the read operation on the basis of the first reference voltage R1 is performed at step 750.

In this case, although the read operation has been performed, a plane to which the plane hold signal has been input at step 722 or 732 is disabled by the operation of the plane control unit 640 or 650. Accordingly, the read operation is not performed on the corresponding plane. For example, in the case where the first plane hold signal is output to the first plane at steps 720 and 722 and the second plane hold signal is not output to the second plane at step 730, only the second plane is operated, but the first plane is disabled. Accordingly, the read operation at step 750 is performed on only the second plane.

Next, after the read operation on the basis of the first reference voltage R1 has been performed, the first or second plane hold signal is disabled at step 760. This disables the plane hold signal which is being output. However, when there is no plane hold signal being output, the above operation may not be performed.

The above program operation may be applied to the second column of FIG. 4 as follows. Only an LSB program operation has been performed on the cells included in the first plane, and an MSB program operation has been performed on the cells included in the second plane. The read operation on the basis of the second reference voltage and the read operation on the basis of the first reference voltage must be sequentially performed on the first plane. However, only the read operation on the basis of the second reference voltage has only to be performed on the second plane. Accordingly, the read operation on the basis of the second reference voltage is performed on the first plane and the second plane at the same time. Furthermore, when the read operation on the basis of the first reference voltage is performed, the second plane is disabled in response to the second plane hold signal, so the read operation can be performed on only the first plane.

As described above, when an LSB read operation for a nonvolatile memory device including planes is performed, a plane not requiring a read operation may be disabled depending on the state of flag cells.

Figure 8:
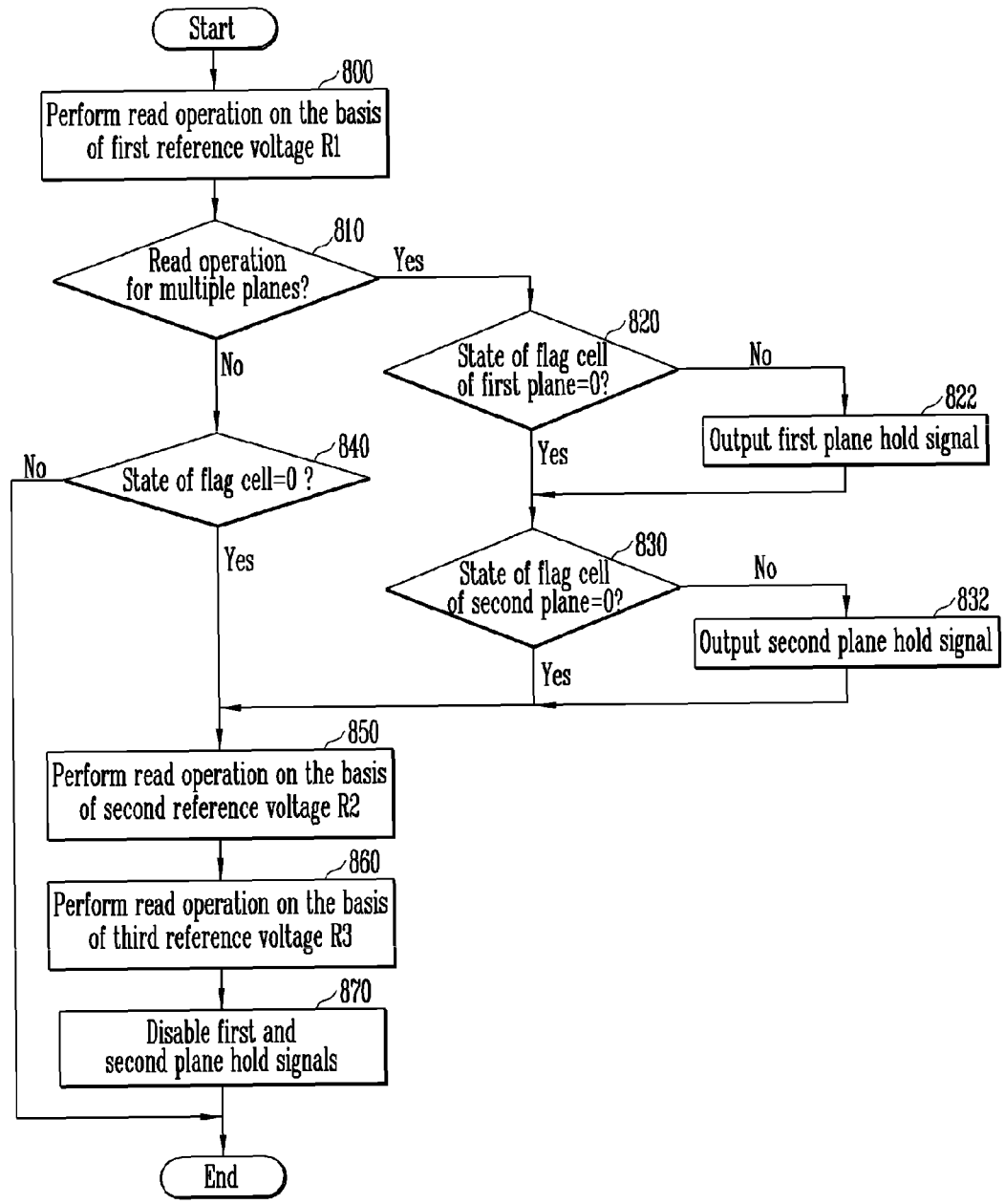
FIG. 8 is a flowchart showing an MSB read method of the nonvolatile memory device according to an embodiment.

FIG. 8 is a flowchart showing an MSB read method of the nonvolatile memory device according to an embodiment.

First, a read operation for the main memory cell and the flag cells are performed on the basis of the first reference voltage R1 at step 800. Here, in the case of a read operation for multiple planes, the read operation is performed on the planes at the same time.

It is then determined whether the read operation is a read operation for multiple planes at step 810. In other words, in the case where the read operation is performed on any one of the planes, the read operation is performed in the same manner as the existing read operation. In the case where the read operation is performed on two or more planes, however, the read operation is performed using a different method.

If, as a result of the determination at step 810, the read operation is determined to be the read operation for a single plane, it is determined whether the flag cells have been programmed to have less than the first reference voltage R1 at step 840. If, as a result of the determination, the flag cells are determined to have been programmed with less than the first reference voltage R1, the read operation is terminated without an additional read operation.

However, if, as a result of the determination at step 840, the flag cells are determined to have been programmed with the first reference voltage R1 or more (the state of the flag cells=0), a read operation on the basis of a first reference voltage R1 and a read operation on the basis of a second reference voltage R2 are sequentially performed at steps 850 and 860.

For the details of the steps 850 and 860, reference can be made to the description of FIG. 2.

If, as a result of the determination at step 810, the read operation is determined to be the read operation for the multiple planes, the state of the flag cells is checked based on the results read at step 800. In other words, it is determined whether, as a result of the read operation on the basis of the first reference voltage R1, the flag cells of the first plane have been programmed to have less than the first reference voltage R1 at step 820. If, as a result of the determination, the flag cells of the first plane are determined to have been programmed with less than the first reference voltage R1, the first plane hold signal P0_HOLD is output at step 822.

As described above, in the case where the flag cells of the first plane are determined to have been programmed with less than the first reference voltage R1, the results read at step 800 are used without performing an additional read operation. Accordingly, it is necessary to disable the first plane because an additional read operation is not necessary. To this end, the first plane hold signal P0_HOLD is output. Meanwhile, if, as a result of the determination at step 820, the flag cells of the first plane are determined to have been programmed with the second reference voltage R1 or more (the state of the flag cells=0), the read operation on the basis of the second reference voltage R2 and the read operation on the basis of the third reference voltage R3 are sequentially performed as described above.

It is then determined whether, as a result of the read operation on the basis of the first reference voltage R1, the flag cells of the second plane are determined to have been programmed with less than the first reference voltage R1 at step 830. If, as a result of the determination, the flag cells of the second plane are determined to have been programmed with less than the first reference voltage R1, the second plane hold signal P1_HOLD is output at step 832.

As described above, in the case where the flag cells of the second plane are determined to have been programmed with less than the first reference voltage R1, the results read at step 800 are used without performing an additional read operation. Accordingly, it is necessary to disable the second plane because an additional read operation is not necessary. To this end, the second plane hold signal P1_HOLD is output at step 832. Meanwhile, if, as a result of the determination at step 830, the flag cells of the second plane are determined to have been programmed with the first reference voltage R1 or more (the state of the flag cells=0), the read operation on the basis of the second reference voltage R2 and the read operation on the basis of the third reference voltage R3 are sequentially performed as described above.

As described above, as a result of the read operation at step 830 or 840, if the flag cells of the plane are determined to have been programmed with the first reference voltage R1 or more (i.e., in the case where an MSB program operation has been performed), the read operation on the basis of the second reference voltage R2 and the read operation on the basis of the third reference voltage R3 are sequentially performed.

In this case, although the read operations have been performed, a plane to which the plane hold signal has been input at step 822 or 832 is disabled by the plane control unit 640 or 650. Accordingly, the read operation is not performed on the corresponding plane. For example, in the case where the first plane hold signal is output to the first plane at steps 820 and 822 and the second plane hold signal is not output to the second plane at step 830, only the second plane is operated, but the first plane is disabled. Accordingly, the read operation at step 850 is performed on only the second plane.

Next, after the read operations on the basis of the second reference voltage R2 and the third reference voltage R3 have been performed, the first or second plane hold signal is disabled at step 870. This disables the plane hold signal which is being output. However, when there is no plane hold signal being output, the above operation may not be performed.

The above program operation may be applied to the third column of FIG. 5 as follows. An MSB program operation has been performed on the cells included in the first plane, and only an LSB program operation has been performed on the cells included in the second plane. The read operation on the basis of the first reference voltage, the read operation on the basis of the second reference voltage, and the read operation on the basis of the third reference voltage must be sequentially performed on the first plane. However, only the read operation on the basis of the first reference voltage has only to be performed on the second plane. Accordingly, the read operation on the basis of the first reference voltage is performed on the first and second planes at the same time. Furthermore, when the read operation on the basis of the second reference voltage and the read operation on the basis of the third reference voltage are performed, the second plane is disabled in response to the second plane hold signal, so the read operations for only the first plane may be performed.

As described above, when an LSB read operation for a nonvolatile memory device including planes is performed, a plane not requiring a read operation may be disabled depending on the state of flag cells.

As described above, when an LSB read operation for a nonvolatile memory device, including planes, is performed, a plane not requiring a read operation may be disabled depending on the state of flag cells.

According to one or more embodiments as described above, a read operation for a nonvolatile memory device having a multi-plane structure, on which an MLC program has been performed, can be optimized. For example, in the case where only an LSB program operation has been performed on the cells of a first plane and only an MSB program operation has been performed on the cells of a second plane, when low-order bit data is read, the same read algorithm is difficult to apply to the two planes. In this case, the second plane may be disabled and the LSB read operation for the first plane may be performed. When high-order bit data is read, the operation of the first plane may be stopped and an MSB read operation for the second plane may be performed.

What is claimed is:

1. A nonvolatile memory device, comprising:
   a first plane and a second plane;
   an address decoder configured to decode an externally input address and to output a first plane select signal and a second plane select signal for enabling a corresponding plane of the first and second planes;
   a controller configured to output a first plane hold signal and a second plane hold signal for disabling any one of the first and second planes depending on program states of the first plane and the second plane;
   a first plane control unit configured to enable the first plane in response to a first plane select signal and the first plane hold signal; and
   a second plane control unit configured to enable the second plane in response to a second plane select signal and the second plane hold signal.

2. The nonvolatile memory device of claim 1, wherein, in the case where a Most Significant Bit (MSB) program operation has been performed on cells of the first plane, the controller outputs the first plane hold signal when a Least Significant Bit (LSB) read operation for the cells is performed.

3. The nonvolatile memory device of claim 1, wherein, in the case where an MSB program operation has been performed on cells of the second plane, the controller outputs the second plane hold signal when an LSB read operation for the cells is performed.

4. The nonvolatile memory device of claim 1, wherein, in the case where flag cells of the first plane has been programmed to have a second reference voltage or more, the controller outputs the first plane hold signal when an LSB read operation for cells connected to the same word line as the flag cells is performed.

5. The nonvolatile memory device of claim 1, wherein, in the case where flag cells of the second plane has been programmed to have a second reference voltage or more, the controller outputs the second plane hold signal when an LSB read operation for cells connected to the same word line as the flag cells is performed.

6. The nonvolatile memory device of claim 1, wherein, in the case where an LSB program operation for cells of the first plane has been performed, the controller outputs the first plane hold signal when an MSB read operation for the cells is performed.

7. The nonvolatile memory device of claim 1, wherein, in the case where an LSB program operation for cells of the second plane has been performed, the controller outputs the second plane hold signal when an MSB read operation for the cells is performed.

8. The nonvolatile memory device of claim 1, wherein, in the case where flag cells of the first plane have been programmed to be less than a first reference voltage, the controller outputs the first plane hold signal when an MSB read operation for cells connected to the same word line as the flag cells is performed.

9. The nonvolatile memory device of claim 1, wherein, in the case where flag cells of the second plane have been programmed to be less than a first reference voltage, the controller outputs the second plane hold signal when an MSB read operation for cells connected to the same word line as the flag cells is performed.

10. The nonvolatile memory device of claim 1, wherein:
the first plane control unit comprises an exclusive-OR gate configured to have the first plane hold signal and the first plane select signal as inputs and to output a first plane enable signal, and
the second plane control unit comprises an exclusive-OR gate configured to have the second plane hold signal and the second plane select signal as inputs and to output a second plane enable signal.

11. A method of operating a nonvolatile memory device, comprising:
performing a read operation on cells of first and second planes on the basis of a second reference voltage;
if, as a result of the read operation, an MSB program operation has been performed on the first plane, outputting a first plane hold signal for disabling the first plane;
if, as a result of the read operation, an MSB program operation has been performed on the second plane, outputting a second plane hold signal for disabling the second plane;
performing a read operation on the basis of a first reference voltage for a plane on which an LSB program operation has been performed as a result of the read operation; and
stopping the output of the first plane hold signal or the second plane hold signal.

12. The method of claim 11, wherein the output of the first plane hold signal for disabling the first plane if, as a result of the read operation, the MSB program operation has been performed on the first plane comprises outputting the first plane hold signal when flag cells of the first plane are determined to have been programmed with the second reference voltage or more.

13. The method of claim 11, wherein the output of the second plane hold signal for disabling the second plane if, as a result of the read operation, the MSB program operation has been performed on the second plane comprises outputting the second plane hold signal when flag cells of the second plane are determined to have been programmed with the second reference voltage or more.

14. The method of claim 11, wherein the execution of the read operation on the basis of the first reference voltage for the plane on which the LSB program operation has been performed as a result of the read operation comprises disabling the first plane or the second plane using the first plane hold signal or the second plane hold signal.

15. A method of operating a nonvolatile memory device, comprising:
performing a read operation on cells of first and second planes on the basis of a second reference voltage;
if, as a result of the read operation, an LSB program operation has been performed on the first plane, outputting a first plane hold signal for disabling the first plane;
if, as a result of the read operation, an LSB program operation has been performed on the second plane, outputting a second plane hold signal for disabling the second plane;
sequentially performing a read operation on the basis of a second reference voltage and a read operation on the basis of a third reference voltage for a plane on which an MSB program operation has been performed as a result of the read operation; and
stopping the output of the first plane hold signal or the second plane hold signal.

16. The method of claim 15, wherein the output of the first plane hold signal for disabling the first plane if, as a result of the read operation, the LSB program operation has been performed on the first plane comprises outputting the first plane hold signal when flag cells of the first plane are determined to have been programmed with less than the first reference voltage.

17. The method of claim 15, wherein the output of the second plane hold signal for disabling the second plane if, as a result of the read operation, the LSB program operation has been performed on the second plane comprises outputting the second plane hold signal when flag cells of the second plane are determined to have been programmed with less than the first reference voltage.

18. The method of claim 15, wherein the sequential execution of the read operation on the basis of the second reference voltage and the read operation on the basis of the third reference voltage for the plane on which the MSB program operation has been performed as a result of the read operation comprises disabling the first plane or the second plane using the first plane hold signal or the second plane hold signal.

* * * * *